United States Patent [19]

Meyer et al.

[11] Patent Number: 5,233,301

[45] Date of Patent: * Aug. 3, 1993

[54] HIGH RESOLUTION/REDUCED SLICE WIDTH MAGNETIC RESONANCE IMAGING AND SPECTROSCOPY BY SIGNAL COMBINATION AND USE OF MINIMUM PHASE EXCITATION PULSES

[75] Inventors: Craig H. Meyer; John M. Pauly, both of Menlo Park, Calif.

[73] Assignee: Board of Trustees of the Leland Stanford Junior University, Stanford, Conn.

[*] Notice: The portion of the term of this patent subsequent to Jun. 18, 2008 has been disclaimed.

[21] Appl. No.: 568,058

[22] Filed: Aug. 16, 1990

Related U.S. Application Data

[63] Continuation-in-part of Ser. No. 386,901, Jul. 28, 1989, Pat. No. 5,025,216.

[51] Int. Cl.$^5$ .............................................. G01R 33/20
[52] U.S. Cl. ..................................... 324/309; 324/307
[58] Field of Search ............................... 324/307, 309

[56] References Cited

U.S. PATENT DOCUMENTS

| | | | |
|---|---|---|---|
| Re. 32,712 | 7/1988 | Likes | 324/309 |
| 4,509,015 | 4/1985 | Ordidge et al. | 324/307 |
| 4,678,996 | 7/1987 | Haacke et al. | 324/309 |
| 4,691,162 | 9/1987 | Van Uijen | 324/309 |
| 4,748,410 | 5/1988 | Macovski | 324/309 |
| 4,797,616 | 1/1989 | Matsui et al. | 324/307 |
| 4,818,942 | 4/1989 | Rzedzian | 324/309 |
| 4,851,779 | 7/1989 | DeMeester | 324/309 |
| 4,876,508 | 10/1989 | Taylor | 324/309 |
| 4,937,526 | 6/1990 | Ehman et al. | 324/309 |
| 4,985,677 | 1/1991 | Pauly | 324/309 |
| 4,993,075 | 2/1991 | Sekihara et al. | 324/309 |
| 4,998,064 | 3/1991 | Fuderer et al. | 324/309 |
| 4,999,580 | 3/1991 | Meyer et al. | 324/309 |
| 5,025,216 | 6/1991 | Pauly et al. | 324/309 |
| 5,051,903 | 9/1991 | Pelc et al. | 324/309 |

Primary Examiner—Michael J. Tokar
Assistant Examiner—Raymond Y. Mah
Attorney, Agent, or Firm—Townsend and Townsend Khourie and Crew

[57] ABSTRACT

A high resolution NMR signal is obtained for a thin slice through a body by combining signals in which excitation k-space is covered in two or more excitations. An RF excitation pulse is applied along with an oscillating (e.g. triangular, trapezoidal, sinusoidal) wave modulated magnetic gradient with the RF pulse having nulls corresponding to zero values of the gradient. The RF pulse is applied a second time with the magnetic gradient inverted NMR signals detected following the application of the RF excitation pulses are summed. Minimum phase RF pulses can be employed to reduce signal dropout and reduce artifacts.

16 Claims, 7 Drawing Sheets

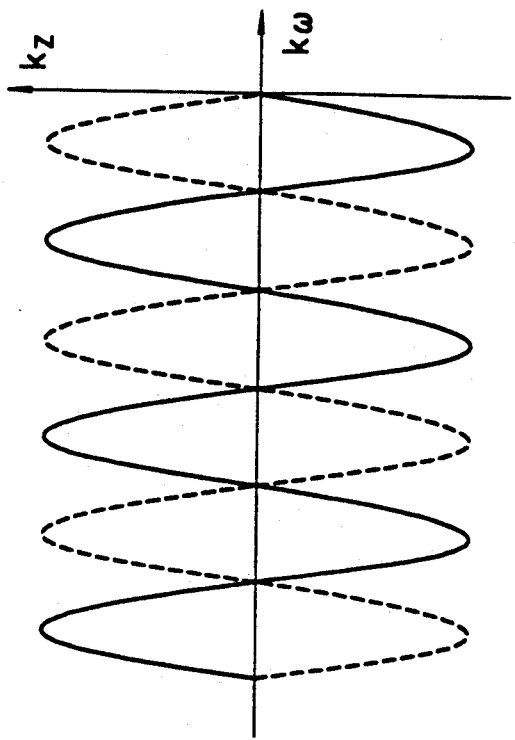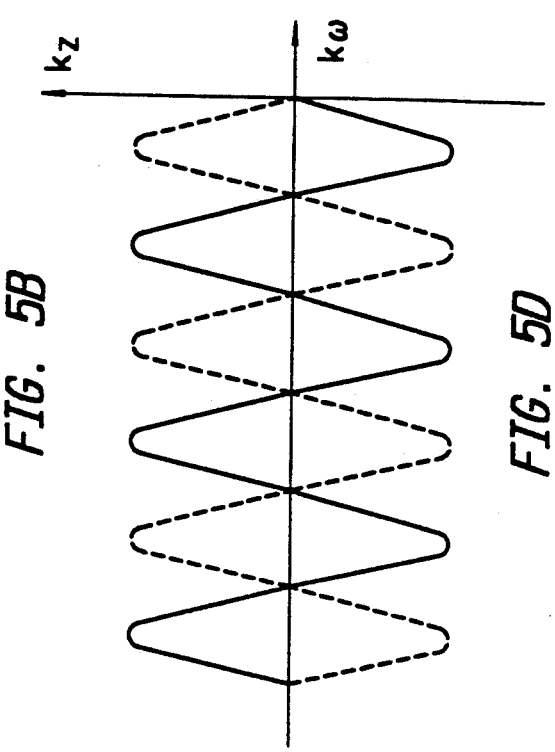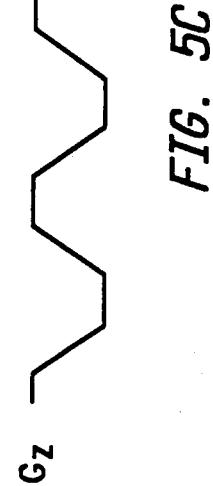

HIGH RESOLUTION/REDUCED SLICE WIDTH MAGNETIC RESONANCE IMAGING AND SPECTROSCOPY BY SIGNAL COMBINATION AND USE OF MINIMUM PHASE EXCITATION PULSES

This application is a continuation-in-part of copending application Ser. No. 386,901, filed Jul. 28, 1989, now U.S. Pat. No. 5,025,216 issued Jun. 18, 1991 for "Magnetic Resonance Imaging of Short T2 Species".

BACKGROUND OF THE INVENTION

This invention relates generally to magnetic resonance imaging (MRI) and spectroscopy, and more particularly the invention relates to simultaneous spatial and spectral selectivity in MRI using a single excitation pulse.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

For a number of imaging applications one would like to selectively examine a particular spatial slice and a particular spectral component of the object at the same time. The most important example of this is two-dimensional water/fat imaging. Water/fat imaging may be desirable as an end in itself, for example as a tool for examining atherosclerotic plaque. It may also be desirable to select for water or fat in order to avoid image artifacts, such as those encountered in rapid imaging sequences. Rapid imaging sequences based on steady-state free precession suffer from artifacts at water/fat boundaries. Rapid k-space scanning sequences can suffer intolerable shifts or blurring of either water or fat.

Disclosed in copending application Ser. No. 07/368,765 filed by the present applicants on Jun. 20, 1989 now U.S. Pat. No. 4,999,580 is a method of obtaining magnetic resonance signals from a body which are spatially and spectrally selective comprising the steps of applying a static magnetic field ($B_o$) to a body thereby aligning nuclear spins, applying a modulated magnetic gradient ($G(t)$) to the body, and applying an RF excitation pulse ($B(t)$) to the body to tip the nuclear spins. The RF excitation pulse is related to said modulated magnetic gradient whereby resulting magnetic resonance signals are spatially and spectrally dependent. The steps can be repeated in a multi-slice or multi-spectral acquisition mode, and the steps can be repeated in a rapid gradient echo pulse sequence.

Such spatial-spectral selective excitation pulses simultaneously excite a spatial slice and a spectral band. These pulses have an oscillating slice-selection gradient ($G_z$) and have been designed and studied using the k-space analysis of selective excitation disclosed by Pauly, Nishimura, and Macovski in "A k-space Analysis of Small-Tip-Angle Excitation," *Journal of Magnetic Resonance* 81, pp. 43-56 (1989). Spatial-spectral pulses are useful for reducing artifacts in fast imaging by selecting for water or fat and for water suppression in spectroscopic imaging as well as other applications.

The minimum slice-width achievable by a spatial-spectral pulse is limited by the rise time of $G_z$ and possibly by the maximum amplitude of $G_z$. The excitation profile of a spatial-spectral pulse along the spectral ($\omega$) axis has a main lobe at the transmitter frequency and sidelobes at $\pm n\Omega$, $n=1\ldots\infty$, where $\Omega$ is the oscillation frequency of $G_z$. The desired spectral component is placed at the main lobe and $\Omega$ is chosen so that the undesired component (or components) falls at a null in the excitation profile. The obvious place to put the undesired component is at the null between the main lobe and the first sidelobe. Since the first sidelobe is at $\omega=\Omega$, $\Omega$ must be approximately twice the difference frequency between the undesired and the desired component. As an example, for water/fat imaging at 1.5 Tesla, the oscillation frequency of $G_z$ using this method would be about 450 Hz. The minimum achievable Gaussian slice width on our system for a spatial-spectral pulse with a 450-Hz Gz is about 10 mm. This slice width meets the requirements of many applications, such as rapid abdominal imaging, but for other applications thinner slice-width is desirable.

The present invention is directed to reducing the achievable slice width, given that the available gradient power is fixed. Of course, with sufficient gradient power any slice width would be achievable in a single spatial-spectral pulse. This is somewhat analogous to the readout phase of MRI, where all of k-space can be scanned in a single shot if sufficient gradient power is available. However, in both cases the dB/dt is ultimately limited in vivo due to physiological effects. To deal with the limited gradient power signals are combined from more than one excitation, with the slice-selection gradient varying between excitations. While each component excitation may excite a somewhat larger spectral or spatial region than desired, the undesired components are cycled in a manner so that they cancel out in the combined signal. The simplest way to look at this process of cancellation is in terms of scanning different parts of excitation k-space during each excitation, ultimately covering the entire region necessary to meet the design specifications.

SUMMARY OF THE INVENTION

In accordance with the present invention, excitation k-space is covered in two or more excitations to reduce MRI slice width and/or improve slice image profiles. In one embodiment, alternating halves of $k_z$ space are covered with the resultant signals combined to achieve a factor of two reduction in slice o width. In another embodiment crisscrossed paths in ($k_z$, $k\omega$) space reduce the slice width of combined signals by a factor of between two and four, depending on gradient parameters.

The RF excitation can have a Gaussian weighting along $k_z$ for reduced thickness or a windowed-sinc weighting for a sharper (but wider) profile. The general technique of covering k-space in more than one excitation can also be used to improve the spectral slice profile or for two-dimensional spatially-selective pulses.

In accordance with a feature of the invention, minimum phase RF pulses are employed to reduce signal dropout due to spectral dephasing during the pulse and to reduce artifacts due to flow and T2 decay of the pulse.

The invention and objects and features thereof will be more readily apparent from the following detailed description and appended claim when taken with the drawings.

The invention and objects and features thereof will be more readily apparent from the following detailed description and appended claims when taken with the drawing.

BRIEF DESCRIPTION OF THE DRAWING

FIGS. 5A–5D are RF and $G_z$ waveforms of pulses that scan two crisscrossing trajectories in excitation k-space in accordance with another embodiment of the invention.

DETAILED DESCRIPTION OF ILLUSTRATIVE EMBODIMENTS

Figure 1A:
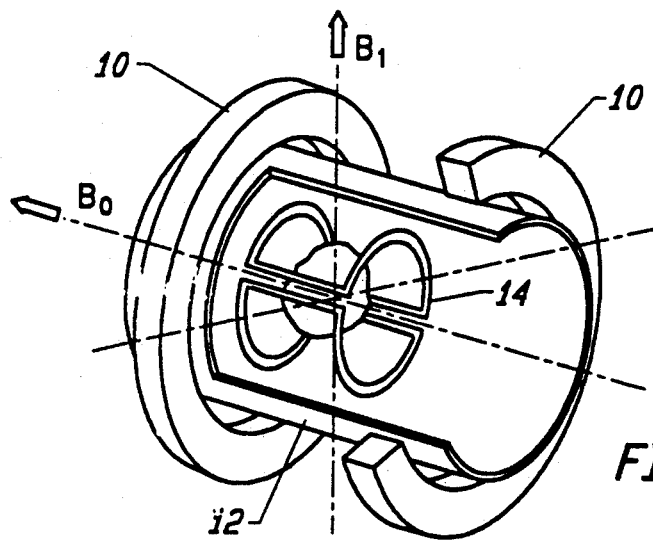
FIGS. 1A–1D illustrate the arrangement of conventional MRI apparatus and magnetic fields generated therein.
Figure 1B:
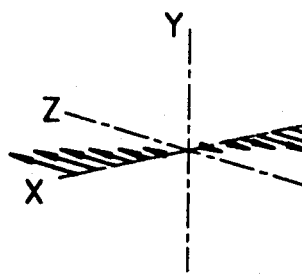
Figure 1C:
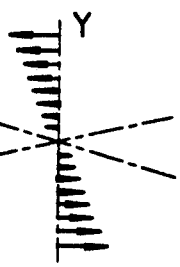
Figure 1D:
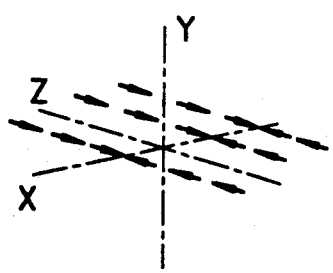

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
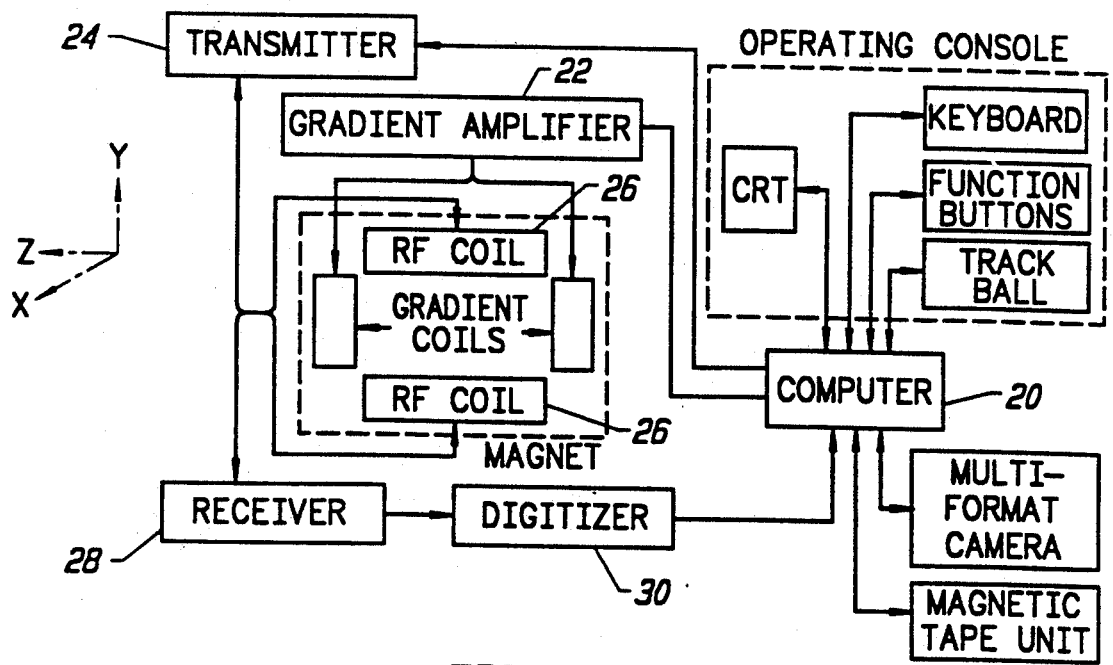
FIG. 2 is a functional block diagram of MRI imaging apparatus.

FIG. 2 is a functional block diagram of the imaging apparatus as disclosed in *NMR—A Perspective on Imaging,* General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
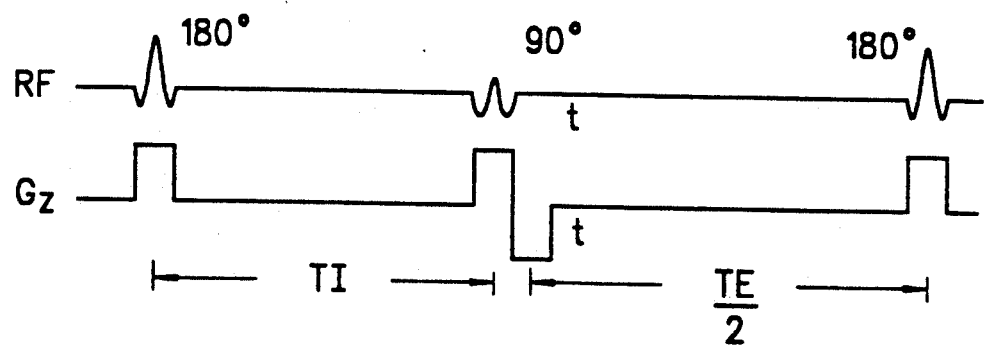
FIG. 3 illustrates a conventional basic pulse sequence for imaging.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween. From this representation, it can be seen that the angle of flip is proportional to the area under the pulse.

The present invention is directed to covering excitation k-space in two or more excitations, thereby covering a larger range of $k_z$. One can concentrate on using this increased coverage of $k_z$ space to reduce the slice width. However, we could just as well use it to achieve improved slice profiles. Examples herein will have Gaussian weighting along $k_z$, because this leads to the thinnest slices. Obviously one could also use a windowed-sinc weighting on that axis to get a sharper (although somewhat wider) profile. The general technique of covering k-space in more than one excitation can also be used to improve the spectral slice profile or even for two-dimensional spatially-selective pulses.

Two different schemes are described for covering excitation k-space. One of these schemes covers alternating halves of $k_z$ space and can achieve a factor of two reduction in slice width, down to 5 mm on a GE Signa system. The other scheme traverses crisscrossed paths in ($k_z$, $k\omega$) space and can reduce the slice width by a factor of between two and four, depending on the exact gradient parameters. On a GE Signa system, this pair can achieve a slice width of 3 mm.

A single-shot spatial-spectral pulse scans a region of ($k_z$, $k\omega$) space that is approximately rectangular, so that is can be selective in both dimensions. Because $k\omega = t - T$, where T is the length of the pulse, the scan is constrained to move linearly with time along the $k\omega$ axis, ending at $k\omega = 0$. Therefore, to cover a rectangular region of k-space the pulse must continuously scan back and forth along the $k_z$ axis as it moves along the $k\omega$ axis. This means that $G_z$ should be periodic with zero area in any period, because $$k_z(t) = \gamma \int_t^T G_z(s)ds.$$

Figure 4B:
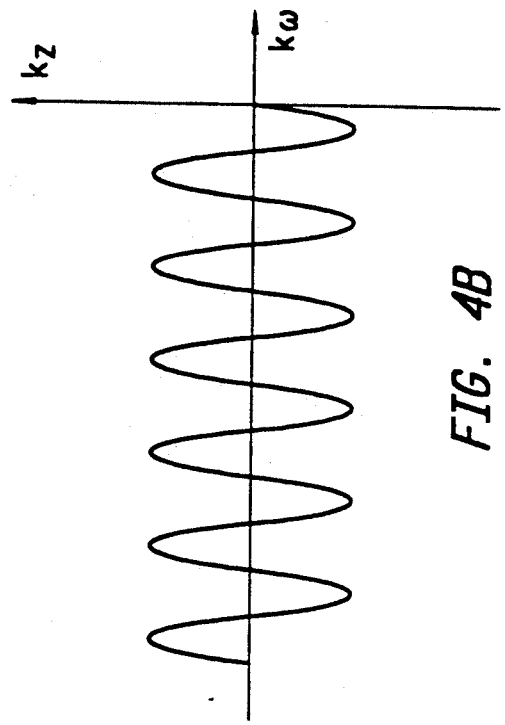
FIGS. 4A–4D are RF and $G_z$ wave forms and excitation k-space trajectories of a conventional single-shot spatial-spectral pulse and of a pulse which scans only positive values of $k_z$ in accordance with one embodiment of the invention.
Figure 4D:
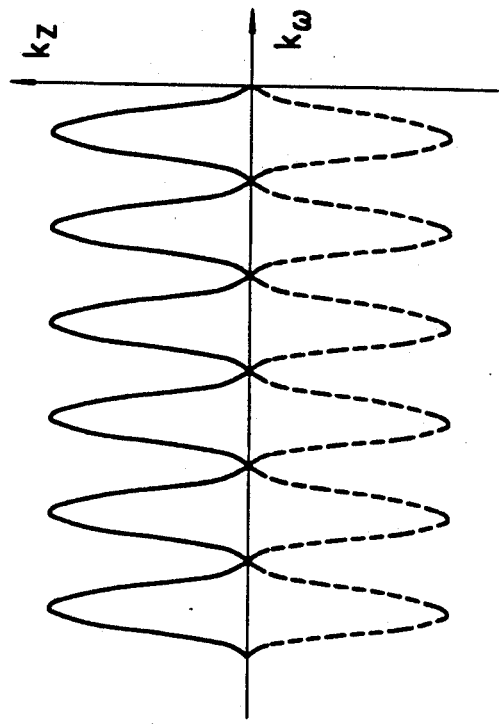
Figure 4A:
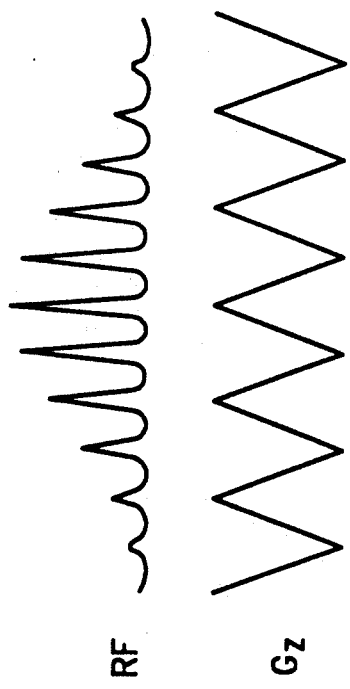

Typically we use triangular, trapezoidal, or sinusoidal oscillations for $G_z$. A typical single-shot spatial-spectral pulse is shown in FIG. 4A and the corresponding k-space trajectory is shown in FIG. 4B. The RF envelope of this pulse has a Gaussian weighting in the $k_z$ direction and the $k\omega$ direction.

Let us examine the case of a water/fat pulse at 1.5 Tesla with a triangular $G_z$ of amplitude A and period T. The exact water/fat difference frequency depends on the particular fat species, but is in the range of 200–230 Hz. The oscillation frequency of $G_z$ must be about twice that, so that T is about 2.4 msec. Assuming that A is set to fullscale gradient amplitude, this means that the transition from negative fullscale to positive fullscale must take place in 1.2 msec, which is approximately the rise time limit of commercial whole-body imagers. Note that triangular gradients lead to the minimum slice width for rise-time-limited gradients, because slice width is proportional to the maximum value of $|k_z|$ and $k_z(t)$ is proportional to the integral of $G_z$. The maximum value of $|k_z|$ is $\gamma$ AT/8 for a triangular waveform.

Figure 4C:
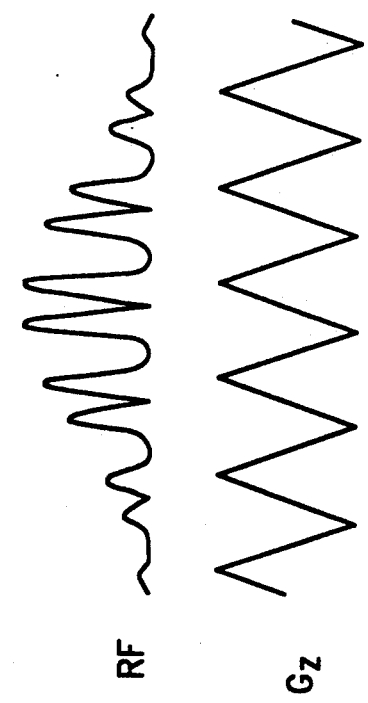

One way to increase the extent of the $k_z$ excursion is to cover positive $k_z$ on one excitation and negative $k_z$ on the following excitation. This technique is related to the Pauly et al. technique for one-dimensional selective excitation of short-$T_2$ species disclosed in copending application Ser. No. 07,/386,901 filed Jul. 28, 1989 now U.S. Pat. No. 5,025,216. A half-$k_z$ pulse that applies this technique is shown in FIG. 4C and the corresponding k-space trajectory is shown in FIG. 4D. The negative values of $k_z$ are traversed on the following excitation by modifying $G_z$ by inversion or phase-shift for example, and then the two signals are combined. The RF weighting functions along the two k-space axes are similar to those of the pulse in FIG. 1A. Note that the RF envelope has somewhat sharp nulls where the amplitude of $G_z$ is zero. This is because the RF envelope is proportional to the product of the $k_z$ weighting, the $k\omega$ weighting, and the k-space velocity, which in turn is proportional to $|G_z(t)|$. These sharp nulls are not apparent in full-$k_z$ pulses because the $G_z$ of those pulses goes through zero at the edges of $k_z$ space where the weighting is close to zero.

One interesting and useful property of this pulse is that $G_z$ has zero amplitude at both the start and the end of the pulse, in contrast to single-shot pulses that typically start and end with $G_z$ at maximum amplitude. This phase shift is precisely what shifts the k-space trajectory along $k_z$, because excitation k-space trajectories always end at the origin and thus a shift in the ending phase of $G_z$ shifts the pulse along $k_z$. This property is useful because no setup or refocusing gradients are required. The desired part of the slice profile is entirely in the $M_y$ component. The undesired part of the slice profile is in the $M_x$ component and has odd symmetry along the z axis. The undesired $M_x$ component is inverted for the negative-$k_z$ pulse and thus cancels out when the signals are combined. This occurs because reversing $G_z$ effectively exchanges the positive z axis with the negative z axis.

Another technique for covering k-space in two excitations is with two crisscrossing paths. A pulse that applies this technique is shown in FIG. 5A and the corresponding k-space trajectory is shown in FIG. 5B. Once again $G_z$ is inverted or otherwise modified to change from one trajectory to the other. The RF weighting functions along the two k-space axes are similar to those of the pulse in FIG. 4A. This pulse scans a larger range of $k_z$ because the period, T, is twice that of a corresponding single-shot pulse. The maximum value of $|k_z|$ is proportional to T, so doubling T cuts the minimum achievable slice width in half for a fixed A.

At first glance this pulse seems to no longer suppress the undesired component, because the first spectral sidelobe of each pulse is now at the frequency of the undesired component. The undesired component will contribute to the signals before they are combined, but because the first sidelobe has odd symmetry along the z axis it will cancel out when the signals are combined. With the half-$k_z$ pulse we cancelled out an undesired spatial component; here we cancel out an undesired spectral component.

If gradient slew rate instead of the amplitude is held constant, the maximum amplitude A can double relative to a single-shot pulse because the time that the gradient is slewing doubles. Under these assumptions this pulse can produce a slice profile one-fourth the width of a single-shot pulse, because the maximum value of $|k_z|$ is proportional to A as well as T.

For water/fat imaging on our imager with a crisscrossing pulse, we are somewhere between the amplitude-limited case and the rise-time-limited case. The pulse in FIG. 5C is optimized for the gradient constraints of our system. It has a trapezoidal $G_z$ and scans the k-space trajectory shown in FIG. 5D. The minimum achievable slice width is one-third the width of a single-shot pulse, or about 3 mm on the GE Signa system. The gradient, $G_z$ in FIGS. 5A and 5C does not begin and end at zero magnitude. However, the gradient can be slightly redesigned to begin and end at zero magnitude at the beginning and end of the RF pulse for set-up and refocusing.

For both of these pulses we have referred to the "combination" of signals resulting from different excitation pulses. By combination we mean either addition or subtraction. Typically we also invert the RF envelope and then subtract the resulting signals in order to remove any dc or low-frequency noise from the receiver electronics.

Figure 6:
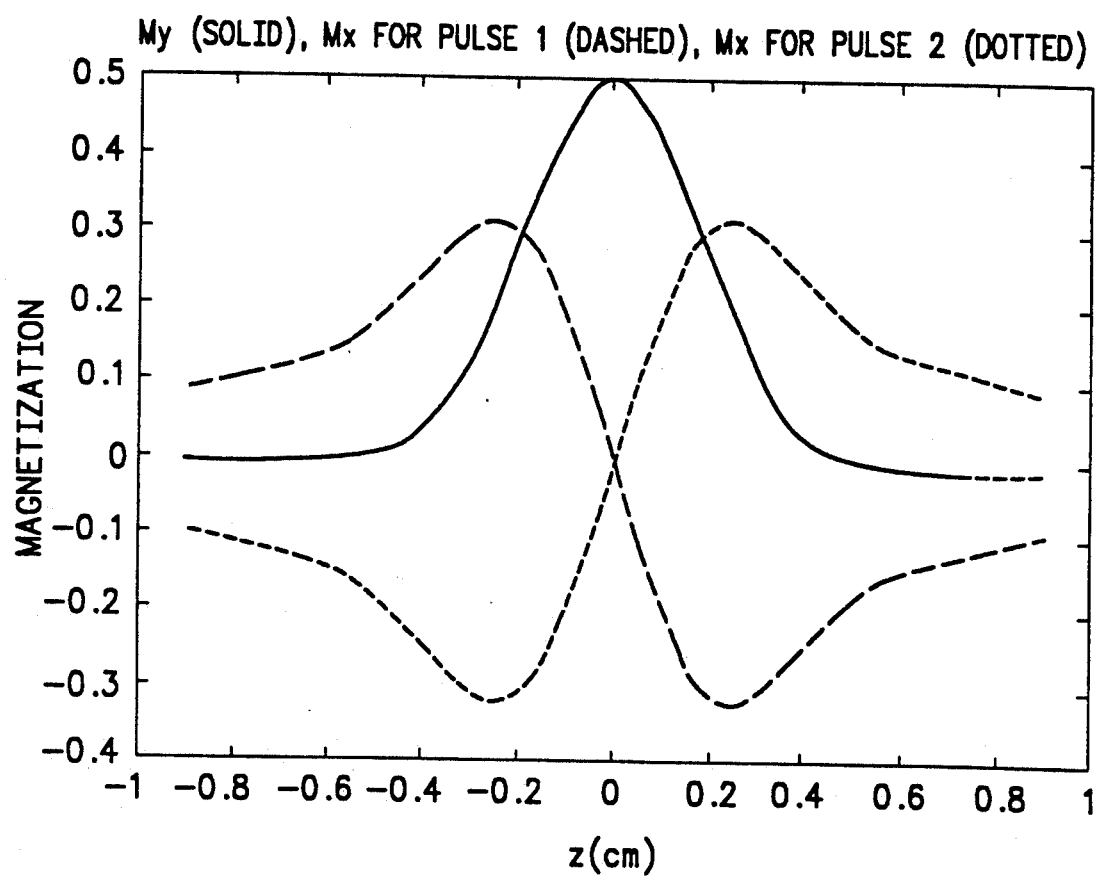
FIG. 6 is a simulated spatial slice profile of the RF pulse in FIG. 4C.

We have verified the performance of these pulses by both numerical simulation and experiment. As an example, FIG. 6 shows the simulated on-resonance spatial slice profile of the half-$k_z$ pulse of FIG. 4C. The desired $M_y$ component as well as the undesired $M_x$ components are shown. It is apparent from this plot that the $M_x$ components cancel out when the signals are combined due to their odd symmetry in z. We have verified this experimentally, both in phantoms and in vivo. To demonstrate that the crisscrossing pulses of FIG. 5 perform as desired it is only necessary to demonstrate the odd symmetry in z of the first spectral sidelobe of any spatial-spectral pulse.

As specific examples of the general technique of covering excitation k-space in more than one excitation, we have introduced two different techniques for reducing the minimum achievable slice width of a spatial-spectral pulse by combining signals from two excitations. One of these techniques involves covering positive $k_z$ on one excitation and negative $k_z$ on another excitation, which reduces the minimum slice width by a factor of two. The other technique involves covering crisscrossing paths in excitation k-space, which reduces the minimum slice width by a factor between two and four, depending on the particular hardware constraints on $G_z$.

The main advantage of using a multiple-excitation spatial-spectral pulse versus a single-excitation pulse is that the minimum slice width achievable can be reduced or, alternatively, the shape of slice profile can be improved. The half-$k_z$ pulse has the additional advantage that no setup or refocusing gradients are required. The biggest disadvantage is of course that the minimum scan time is increased. In many cases, particularly in rapid gradient-echo imaging, the minimum scan time may be determined by signal-to-noise considerations. In this case the signal combination needed for the spatial spectral pulse also performs the necessary averaging. Another possible disadvantage is that there may be some degradation of the slice profile or suppression of the undesired component if the subject moves during the scan, although this effect should be small if the signals to be combined are acquired consecutively. The steady-state response of the half-$k_z$ pulse will be different than that of a single-shot pulse; the extent of this effect depends upon the parameters of the scan and the subject, but will not be pronounced for flip angles elow the Ernst angle. The half-$k_z$ pulse will also perform some mild spatial presaturation, because the slice profile of the $M_x$ component extends outside the slice. The half-$k_z$ pulse can not be used in a contiguous multi-slice mode for the same reason, but it can be used in multi-spectrum mode. The crisscrossing pulse can be used in multi-slice mode, but can not be used in multi-spectrum mode (i.e., interleaved water/fat acquisitions), because the undesired component is excited by the pulse.

From the above description, the relative advantages of the half-$k_z$ pulse versus the interleaved pulse are apparent. The half-$k_z$ pulse's advantages are that (1) no setup or refocusing gradients are required, and (2) multi-spectrum acquisition is possible. The crisscrossing pulse's advantages are that (1) the minimum achievable slice-width is thinner, (2) contiguous multi-slice acquisition is possible, and (3) the undesired component (e.g., fat) is suppressed further by partial saturation because it is excited by the pulse.

In accordance with another feature of the invention, minimum phase RF pulses are employed to reduce signal dropout and reduce artifacts. By using the Pauly et al. k-space analysis of selective excitation, it is possible to design the spatial and spectral selectivity independently. Minimum-phase design is a type of spectral design that has not been used for spatial-spectral pulses before. The resulting pulses have the same magnitude spectral selectivity as a linear-phase pulse, but have decreased signal dropout due to spectral dephasing during the pulse and fewer artifacts due to flow and $T_2$ decay during the pulse.

Linear-phase pulses, which are symmetric about their midpoint, are commonly used as excitation pulses in NMR. A linear-phase pulse has the advantage that the phase can be removed by refocusing. A one-dimensional spatially-selective linear-phase pulse can be refocused by applying a refocusing gradient lobe. A one-dimensional spectrally-selective linear-phase pulse can be refocused by applying a 180-degree time-reversal pulse.

Figure 7A:
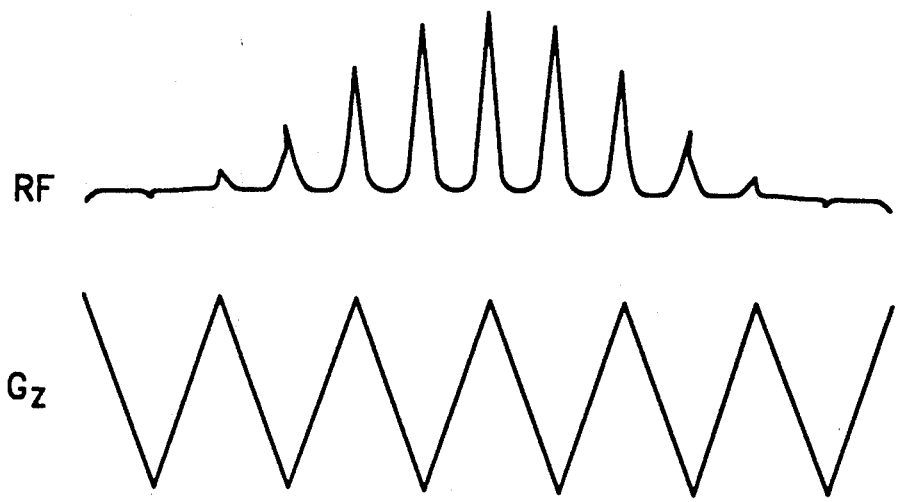
FIGS. 7A are RF and $G_z$ waveforms for a linear-phase spatial-spectral pulse and for a minimum-phase spatial-spectral pulse having the same magnitude spectral profile in accordance with another embodiment of the invention.
Figure 7B:
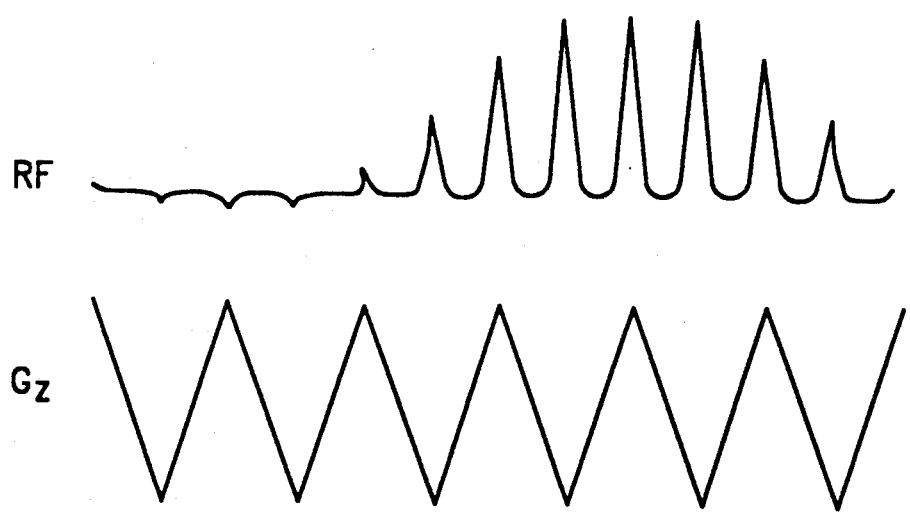
Figure 8A:
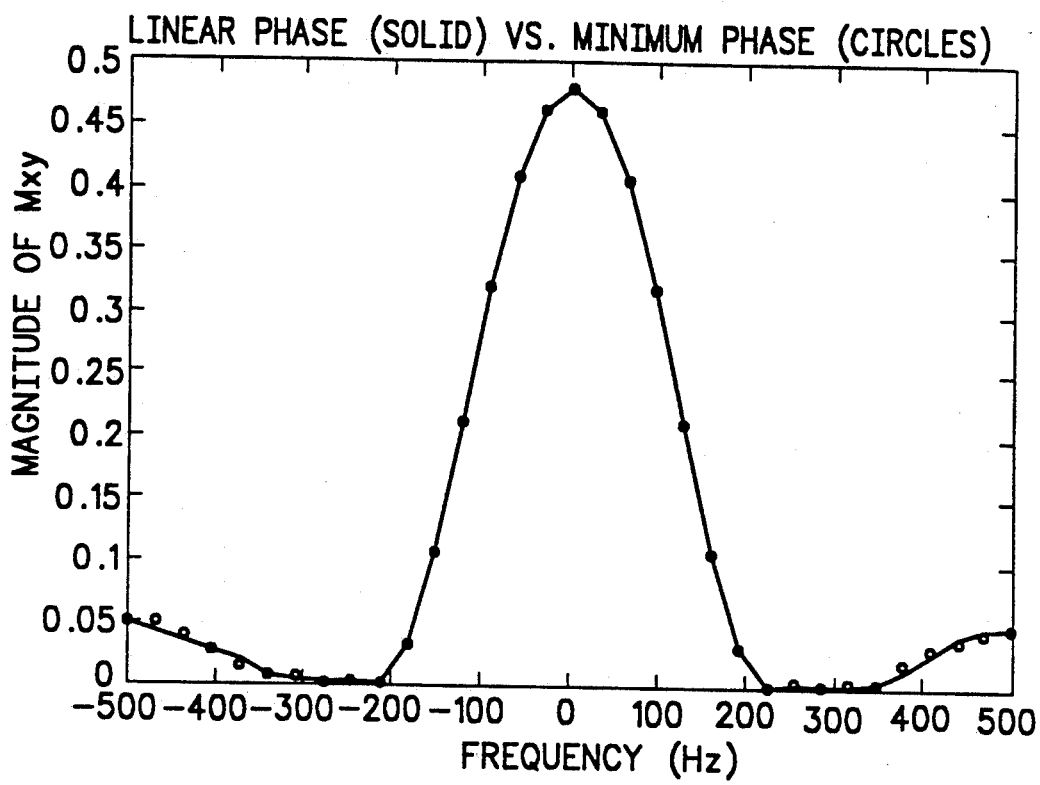
FIGS. 8A and 8B are plots of the magnitudes and phases of the spectral response of the pulses of FIGS. 7A, 7B from numerical simulation.
Figure 8B:
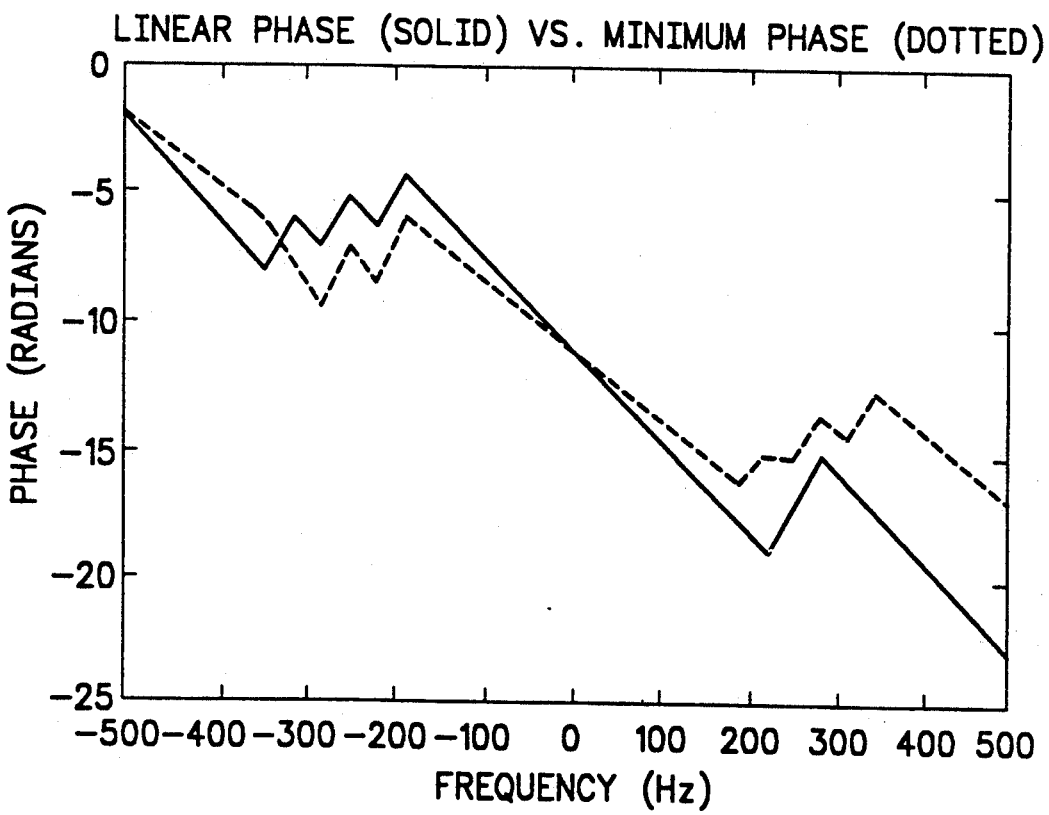

If a spatial-spectral pulse is in a sequence with a 180-degree refocusing pulse, then the correct spectral weighting is a linear-phase spectral weighting. However, if not, then the correct spectral weighting is a minimum phase spectral weighting, because of the decreased spectral dephasing during the pulse. FIG. 7A shows the RF and $G_z$ of a linear-phase spatial-spectral pulse (as in FIG. 4A), and FIG. 4B illustrates a minimum-phase spatial-spectral pulse derived from the linear-phase pulse. Note that the energy of the minimum-phase pulse is concentrated near the end of the pulse, so that spins are tipped down as late as possible during the pulse. FIGS. 8A and 8B show the simulated response of the pulses and verifies that the spectral dephasing is less for the minimum-phase pulse. This has been verified experimentally.

There has been described a method of obtaining high resolution magnetic resonance image signals from the thin slice of a body through use of signal combination in which excitation k-space is covered in two or more excitations. Minimum phase RF excitation pulses can be utilized to reduce signal dropout due to spectral dephasing and to reduce artifacts.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of obtaining a magnetic resonance signal form a slice through a body which is spatially and spectrally selective comprising the steps of
   a) applying a static magnetic filed ($B_o$) to said body thereby aligning nuclear spins,
   b) applying a first RF excitation pulse (RF) to said body to tip said nuclear spins,
   c) applying a modulated magnetic gradient ($G_z$) simultaneously with step (b), the waveform of said gradient and the waveform of said first pulse being related whereby k-space has a first trajectory,
   d) detecting a first magnetic resonance signal,
   e) applying a second RF excitation pulse (RF) to said body to tip said nuclear spins,
   f) modifying the waveform of said modulated gradient ($G_z$) and re-applying said modulated magnetic gradient ($G_z$) simultaneously with step (e) whereby k-space has a second trajectory,
   g) detecting a second magnetic resonance signal, and
   h) combining said first magnetic resonance signal and said second magnetic resonance signal to produce an enhanced magnetic resonance signal.

2. The method as defined by claim 1 wherein steps (e), (f), and (g) are repeated.

3. The method as defined by claim 1 wherein said first trajectory covers positive $k_z$ and said second trajectory covers negative $k_z$.

4. The method as defined by claim 3 wherein step (h) emphasizes the y component of the slice profile and cancels the x component of the slice profile.

5. The method as defined by claim 4 wherein said magnetic gradient ($G_z$) is a triangular wave.

6. The method as defined by claim 5 wherein said RF pulses have sharp nulls where said gradient is zero.

7. The method as defined by claim 5 wherein said RF excitation pulses have a minimum-phase spectral weighting to limit spectral dephasing.

8. The method as defined by claim 1 wherein said RF excitation pulses have a minimum-phase spectral weighting to limit spectral dephasing.

9. The method as defined by claim 1 wherein said first trajectory and said second trajectory criss-cross in k-space.

10. The method as defined by claim 9 wherein said magnetic gradient ($G_z$) is a triangular wave, and said RF pulses have sharp nulls where said gradient is zero.

11. The method as defined by claim 10 wherein said RF excitation pulses have a minimum-phase spectral weighting to limit spectral dephasing.

12. The method as defined by claim 1 wherein said magnetic gradient ($G_z$) has a shape selected from a group consisting of triangular, trapezoidal, and sinusoidal.

13. Apparatus for obtaining a magnetic resonance from a slice through a body which is spatially and spectrally selective comprising
   a) a means for applying a static magnetic field ($B_o$) to said boy thereby aligning nuclear spins,
   b) means for applying a first RF excitation pulse (RF) to said body to tip said nuclear spins,
   c) means for applying a modulated magnetic gradient ($G_z$) simultaneously with step (b), the waveform of said gradient and the waveform of said first pulse profile being related whereby k-space has a first trajectory, d) means for detecting a first magnetic resonance signal, e) means for applying a second RF excitation pulse (RF) to said body to tip said nuclear spins, f) means for modifying the waveform of said modulated magnetic gradient ($G_z$) and applying the modified modulated magnetic gradient ($G_z$) simultaneously with step (e) whereby k-space has a second trajectory, g) means for detecting a second magnetic resonance signal, and h) means for combining said first magnetic resonance signal and said second magnetic resonance signal to produce an enhanced magnetic resonance signal.

14. Apparatus as defined by claim 13 wherein said magnetic gradient ($G_z$) is a triangular wave, and said RF pulses have sharp nulls where said gradient is zero.

15. Apparatus as defined by claim 13 wherein said RF excitation pulses have a minimum-phase spectral weighting to limit spectral dephasing.

16. Apparatus as defined by claim 13 wherein said magnetic gradient ($G_z$) has a shape selected from a group consisting of triangular, trapezoidal, and sinusoidal.

* * * * *